US006714069B1

(12) United States Patent
Chevallier (10) Patent No.: US 6,714,069 B1
(45) Date of Patent: Mar. 30, 2004

(54) SELF-CONFIGURABLE AMPLIFIER CIRCUIT

(75) Inventor: Gilles Chevallier, Langrune/Mer (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/069,536

(22) PCT Filed: Jun. 28, 2001

(86) PCT No.: PCT/EP01/07406
§ 371 (c)(1),
(2), (4) Date: Feb. 25, 2002

(87) PCT Pub. No.: WO02/01712
PCT Pub. Date: Jan. 3, 2002

(30) Foreign Application Priority Data

Jun. 30, 2000 (FR) .............................. 00 08542

(51) Int. Cl.[7] .............................. H03F 1/14; H03F 3/45

(52) U.S. Cl. .............................. 330/51; 330/69; 330/301
(58) Field of Search ........................ 330/51, 69, 124 R, 330/252, 301

(56) References Cited

U.S. PATENT DOCUMENTS 3,757,241 A * 9/1973 Kime et al. ................ 330/69 X
5,648,742 A 7/1997 Ghaffaripour et al. ........ 330/51

FOREIGN PATENT DOCUMENTS

WO WO0201712 6/2001 ............. H03F/3/30

* cited by examiner

Primary Examiner—Steven J. Mottola
(74) Attorney, Agent, or Firm—Aaron Waxler (57) ABSTRACT

An amplifier circuit is disclosed which receives signals that cause the amplifier to be configured in an asymmetrical mode or symmetrical mode, so that performance may be optimized in each mode.

9 Claims, 6 Drawing Sheets

SELF-CONFIGURABLE AMPLIFIER CIRCUIT

FIELD OF THE INVENTION

The invention relates to the field of tuners. The invention also relates to devices wherein such tuners are implemented, such as television receivers, video recorders or decoder boxes. The invention more particularly relates to an amplifier circuit comprising:

a pre-amplifying stage, an amplifying stage, and identification means for identifying the configuration of the amplifying stage.

PRIOR ART

Such an amplifier circuit is known from the PCT patent application published under publication no. WO 00/21193.

According to this patent application, when an amplifying stage 511 is configured so as to be in the asymmetrical mode, i.e. when different outputs of this amplifying stage are connected together, a commutator Sw controlled by control means 53 connects one of the outputs $O_2$ of the amplifying stage 511 to ground. A configuration in an asymmetrical mode of an amplifying stage optimized for operation in the symmetrical mode causes a deterioration of the amplification characteristics. The magnitude of this deterioration can be limited to some extent by connecting one of the outputs of the amplifying stage to ground. In an improved variant, as shown in FIG. 2 of said patent application, commutation means 2513 comprise two commutators. When the amplifying stage 2511 is configured so as to be in the symmetrical mode, a first commutator: SW 22 is open so that the gain of the amplifier circuit is determined by a first set of resistors $R_1$, $R_2$ and $R_4$. When the amplifying stage 2511 is configured so as to be in the asymmetrical mode, a single output branch of the amplifying stage is used, and it is suitable to increase the gain of said branch. For this purpose, the commutator SW 22 is in the closed state and a resistor $R_3$ is introduced into the circuit, thereby increasing the gain of the branch that is still being used.

Said patent application does not indicate how the controller 53 is controlled so as to either activate or not activate the commutation means SW, $SW_{21}$, $SW_{22}$. Persons skilled in the art are also well aware of the fact that the modification of the amplifier circuit intended to limit the deterioration of the amplification characteristics only palliates this deterioration, and that the correction is not the optimum that can be achieved in the asymmetrical mode.

BRIEF DESCRIPTION OF THE INVENTION

It is an object of the invention to overcome the drawbacks described hereinabove by providing an amplifier circuit which can suitably be configured, in a flexible manner, so as to be in the symmetrical or asymmetrical mode, the performance of the circuit being automatically optimized irrespective of the mode of operation of the circuit resulting from its configuration.

Thus, in accordance with the invention, an amplifier circuit in accordance with the opening paragraph is characterized in that it additionally comprises adaptation means to configure the pre-amplifying stage in such a manner that it supplies the amplifying stage with:

either two signals which are in phase opposition if the amplifying stage is configured so as to be in the symmetrical mode, or two signals which are in phase if the amplifying stage is configured so as to be in the asymmetrical mode.

By virtue of the invention, in either mode of operation, i.e. the symmetrical or asymmetrical mode, the performance of the amplifier circuit as regards gain, linearity and output impedance meets the expectations of a circuit optimized for operation in said mode. Thus, unlike the prior art, it is not merely a limitation of the degradation in performance resulting from a configuration other than the configuration for which the amplifier circuit has been designed, but instead an optimization of each one of the configurations.

In the amplifier circuit in accordance with the prior art, a part of the amplifying stage is deactivated during operation in the asymmetrical mode, the gain of the other part being then increased. In accordance with the invention, the whole amplifying stage is used to full advantage to generate the output signal of the amplifier circuit, irrespective of the configuration chosen.

Thus, in its most general mode, the invention relates to a method of optimizing the operation of an amplifier circuit, comprising:

a pre-amplifying stage, and an amplifying stage, which method includes an identification step for identifying the configuration of the amplifying stage, characterized in that the method additionally comprises a configuration step for configuring the pre-amplifying stage, as a result of which the amplifying stage is supplied with:

either two signals which are in phase opposition if the amplifying stage is configured so as to be in the symmetrical mode, or two signals which are in phase if the amplifying stage is configured so as to be in the asymmetrical mode.

In accordance with an embodiment of the invention, the pre-amplifying stage may comprise two pre-amplifiers, which are both arranged between two inputs of the amplifier circuit and two inputs of the amplifying stage, the adaptation means alternately activating one of the two pre-amplifiers and deactivating the other.

The first pre-amplifier amplifies the input signal in such a way that the signals present at each one of the outputs are in phase opposition with respect to one another. The second pre-amplifier amplifies the input signal in such a way that the signals present at each one of the outputs of the pre-amplifying stage are in phase.

BRIEF DESCRIPTION OF THE DRAWINGS

Other advantages will be apparent from the description of an embodiment of the invention, which description is given with reference to the annexed drawings, wherein.

In each one of the drawings, like reference numerals refer to like parts.

DESCRIPTION OF AN EMBODIMENT IN ACCORDANCE WITH THE INVENTION

Figure 1:
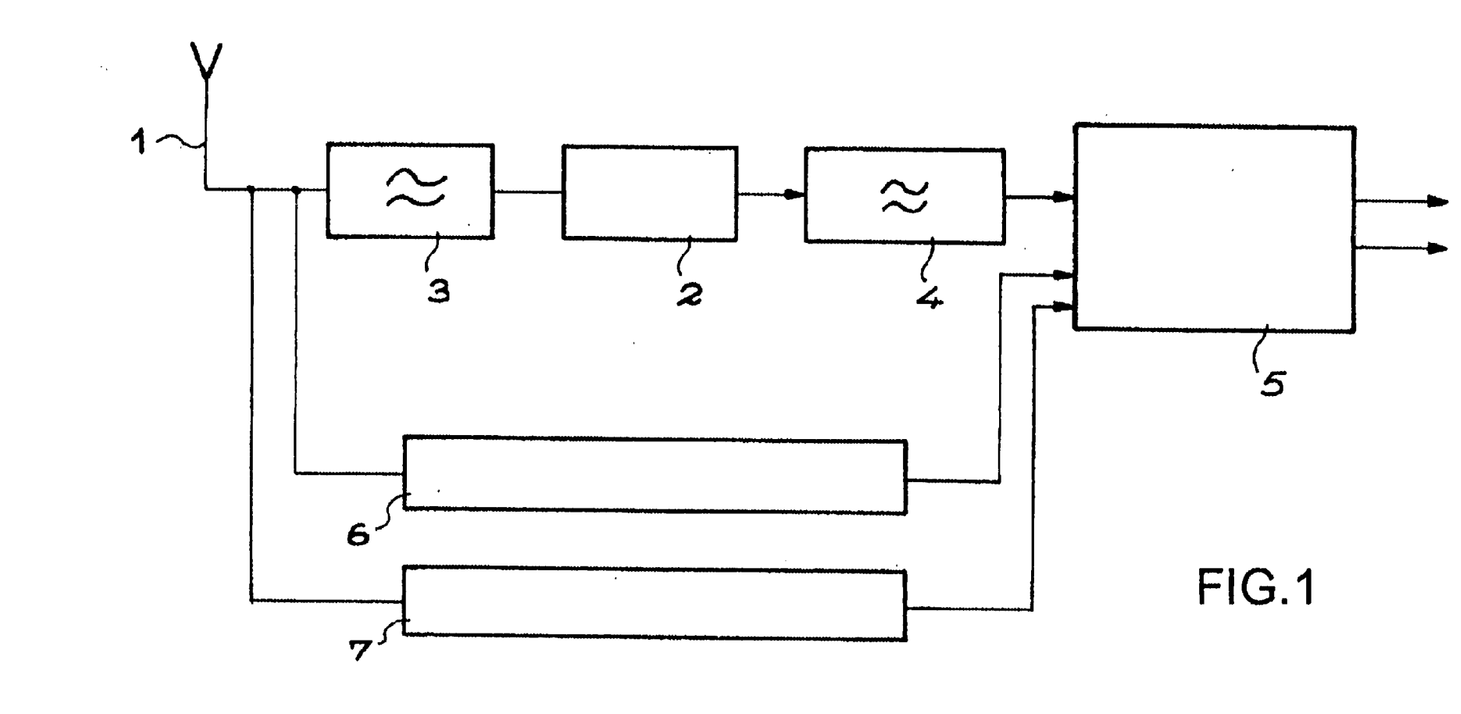
FIG. 1 is a functional diagram of a receiver of radioelectric signals, wherein the invention is implemented.

FIG. 1 diagrammatically shows a receiver for receiving radioelectric signals, for example a television receiver, which comprises, downstream of an input stage, constituent in this example by an antenna 1:

an amplifier 2 receiving the antenna signal through one or several passband filters 3, and a tuner 5 receiving, through the filters 4, a signal originating from the amplifier 2. The tuner 5 supplies an output signal having an intermediate frequency. Usually, a tuner doesn't comprise only a single chain composed of the elements 2 through 4. A tuner often comprises additional chains, diagrammatically represented in this example by reference numerals 6 and 7. Each one of the chains can be tuned to a particular frequency included in a band of operation of the chain. The intermediate frequency IF at the output of the tuner 5 is always the same. Its value generally lies between 30 and 60 MHz.

Figure 2:
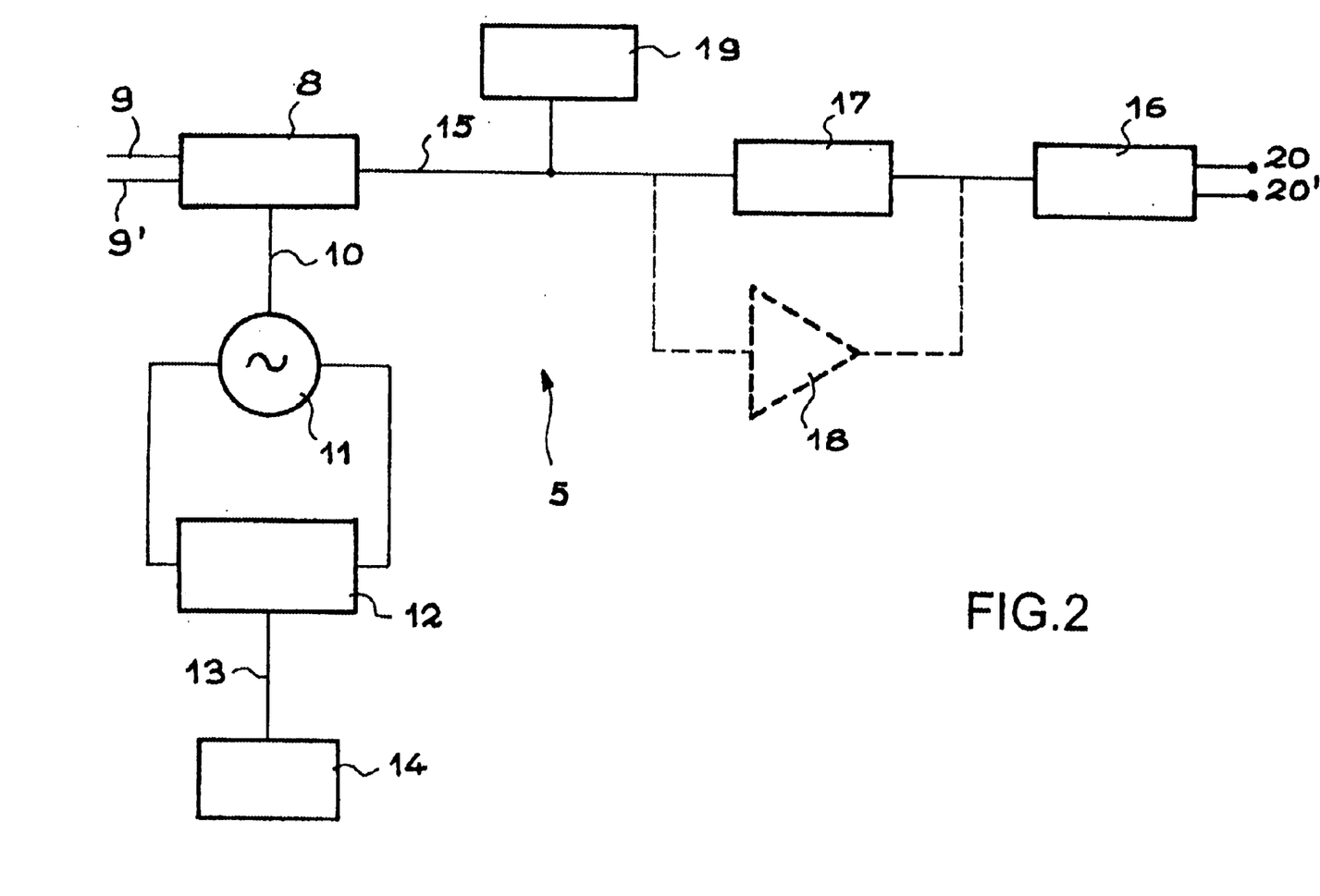
FIG. 2 is a functional diagram of a tuner included in such a receiver.

FIG. 2 diagrammatically shows a tuner 5 comprising a mixer 8 receiving, at an input 9, the amplified antenna signal and, at an input 10, a signal originating from a local oscillator 11. The frequency of the oscillator 11 is controlled by a phase-locked loop 12, which itself is controlled, through a bus 13, by a microcontroller 14. The output 15 of the mixer 8 conveys an intermediate frequency signal, which can be transmitted in one or several channels, for example, in the single sideband (SSB). If there are several channels, the signal is introduced, for example, at a surface wave filter 16 which is intended to separate the channels. In accordance with a first variant, which is generally used in Europe, the surface wave filter 16 is a high-impedance filter, for example 500 Ω, and the introduction of the signal takes place through a passband filter 17. In accordance with a second variant, which is more generally used in Asia and indicated by means of dashed lines, the output signal 15 of the mixer 8 is amplified by an amplifier 18 before being introduced into the acoustic wave filter 16 having an output 20. One or several wall filters, such as the one bearing reference numeral 19, which is used for trapping certain frequencies, may be used for filtering the output signal 15. In the application described hereinabove, the circuit in accordance with the invention is arranged downstream of the tuner 5.

Figure 3:
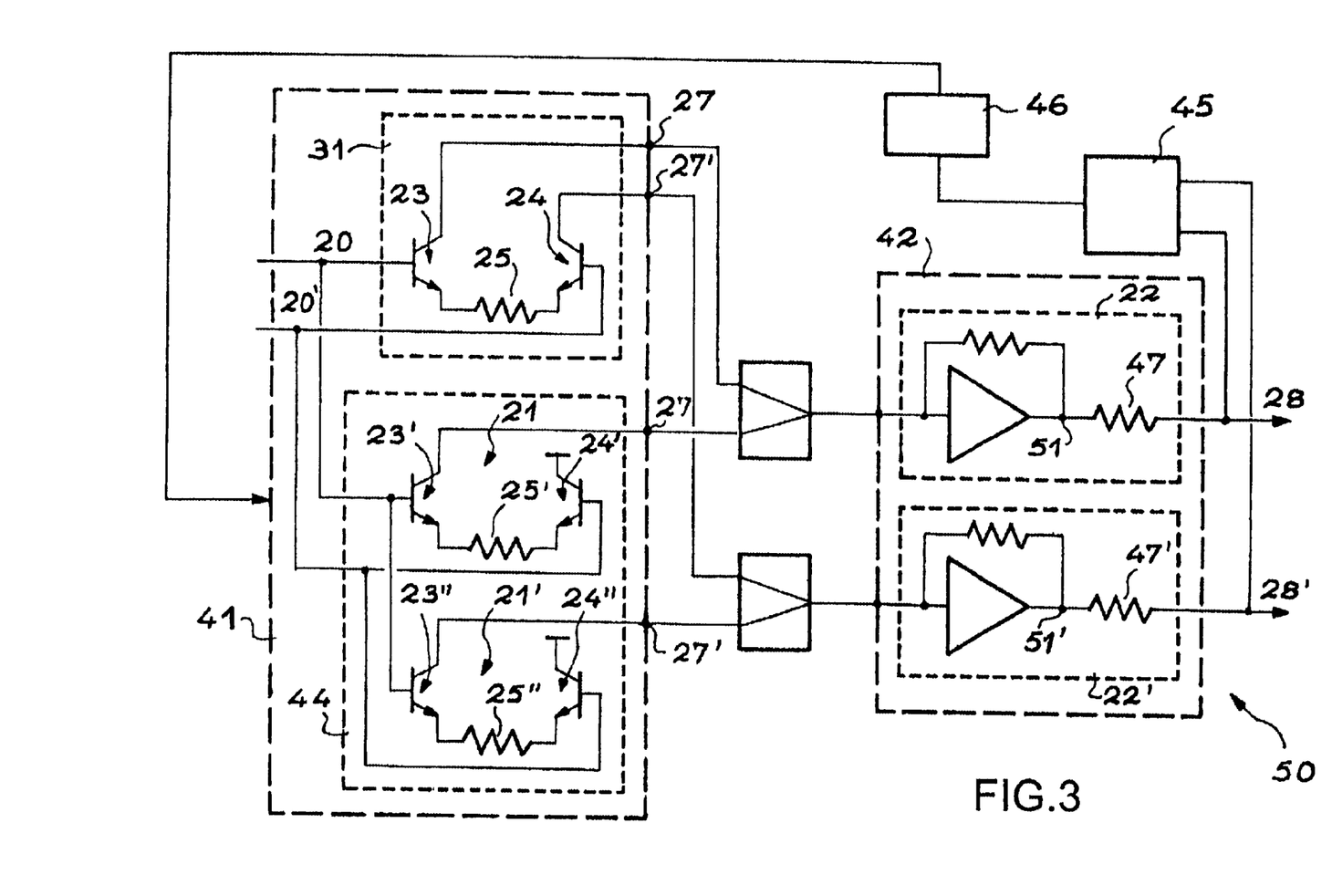
FIG. 3 is a functional diagram of an embodiment in accordance with the invention.

FIG. 3 shows an amplifier circuit 50 in accordance with a particular embodiment of the invention, said amplifier circuit having two inputs 20, 20' and two outputs 28, 28'. The circuit 50 comprises a pre-amplifying stage 41, two inputs of which are connected to inputs 20, 20' of the amplifier circuit, and two outputs 27, 27' of which are connected to two inputs of the amplifying stage 42 comprising two amplifiers 22, 22'. The preamplifying stage 41 comprises a first and a second pre-amplifier 31, 44 which are arranged in parallel between the inputs 20, 20' and the outputs 27, 27' of the pre-amplifying stage. The outputs of the first pre-amplifier 31 convey signals which are in phase opposition.

The outputs of the second pre-amplifier 44 carry signals which are in phase. The two pre-amplifiers 31, 44 never operate simultaneously; they operate alternately according to the configuration of the amplifying stage 42. The second pre-amplifier 44 is itself composed of two parts 21, 21'.

Each part 31, 21 and 21' comprises a long-tail pair of transistors (23, 24); (23', 24'); and (23", 24"), respectively, the control terminals of which are formed by the bases of said transistors, and an output terminal of which is formed by the collector of one of the transistors of the long-tail pair.

The bases of the transistors 23, 23' and 23" are connected to the input 20, while the bases of the transistors 24, 24' and 24" are connected to the inputs 20'. As the control terminals of the long-tail pairs (23', 24') and (23", 24") included in the second pre-amplifier 44 are identically coupled for both long-tail pairs, the outputs 27 and 27' of the second pre-amplifier 44 supply current signals which are in phase. In addition, the gains of the long-tail pairs (23, 24), (23', 24'), (23", 24") included in the pre-amplifiers 31 and 44 can be advantageously made variable so as to enable an increase of the flexibility of the amplifier circuit. This can be achieved by choosing variable current sources to bias said long-tail pairs, according to a technique which is well known to those skilled in the art Though, in this example, bipolar-type transistors are employed, these transistors can be substituted with MOS-type transistors, the grids of which would then form the control terminals. The two amplifiers 22 and 22' are used simultaneously irrespective of which one of the pre-amplifiers 31 or 44 is activated.

The configuration of the pre-amplifying stage 41 is carried out as follows: In the embodiment discussed herein, the first symmetrical output pre-amplifier 31 is selected by default Of course, it is also possible to select the second pre-amplifier 44 by default. The connection of outputs 28, 28' of the amplifier circuit 50 in the short-circuit configuration, i.e. in the asymmetrical mode, or to a load impedance, i.e. in the symmetrical mode, is most often definitively performed by the manufacturer of the apparatus which incorporates said amplifier circuit. The amplification circuit 50 is provided with identification means 45 of the configuration as the amplifying stage 42, which identification means are parallel connected to a load impedance, not shown in the drawing, between the outputs 28 and 28'. The identification means 45 produce a so-called selection signal, the value of which enables the presence of a weak load impedance to be identified, i.e. a load impedance value below a predetermined threshold, or the presence of a standard load impedance corresponding to a situation wherein the amplifier circuit 50 is configured so as to be in the symmetrical mode. The selection signal is transmitted to adaptation means 46. If the selection signal indicates that the amplifying stage 42 is not configured to operate in the symmetrical mode, i.e. using the pre-amplifier 31 provided by default, then the adaptation means 46 are activated by the selection signal. If the adaptation means are activated, they cause the transistors (23, 24) of the first pre-amplifier 31 to become deactivated, and the transistors (23'24'); (23"24") of the second pre-amplifier 44 to become activated. Activation or deactivation of the transistors is obtained by, respectively, activating or deactivating the current sources biasing the transistors.

Figure 4:
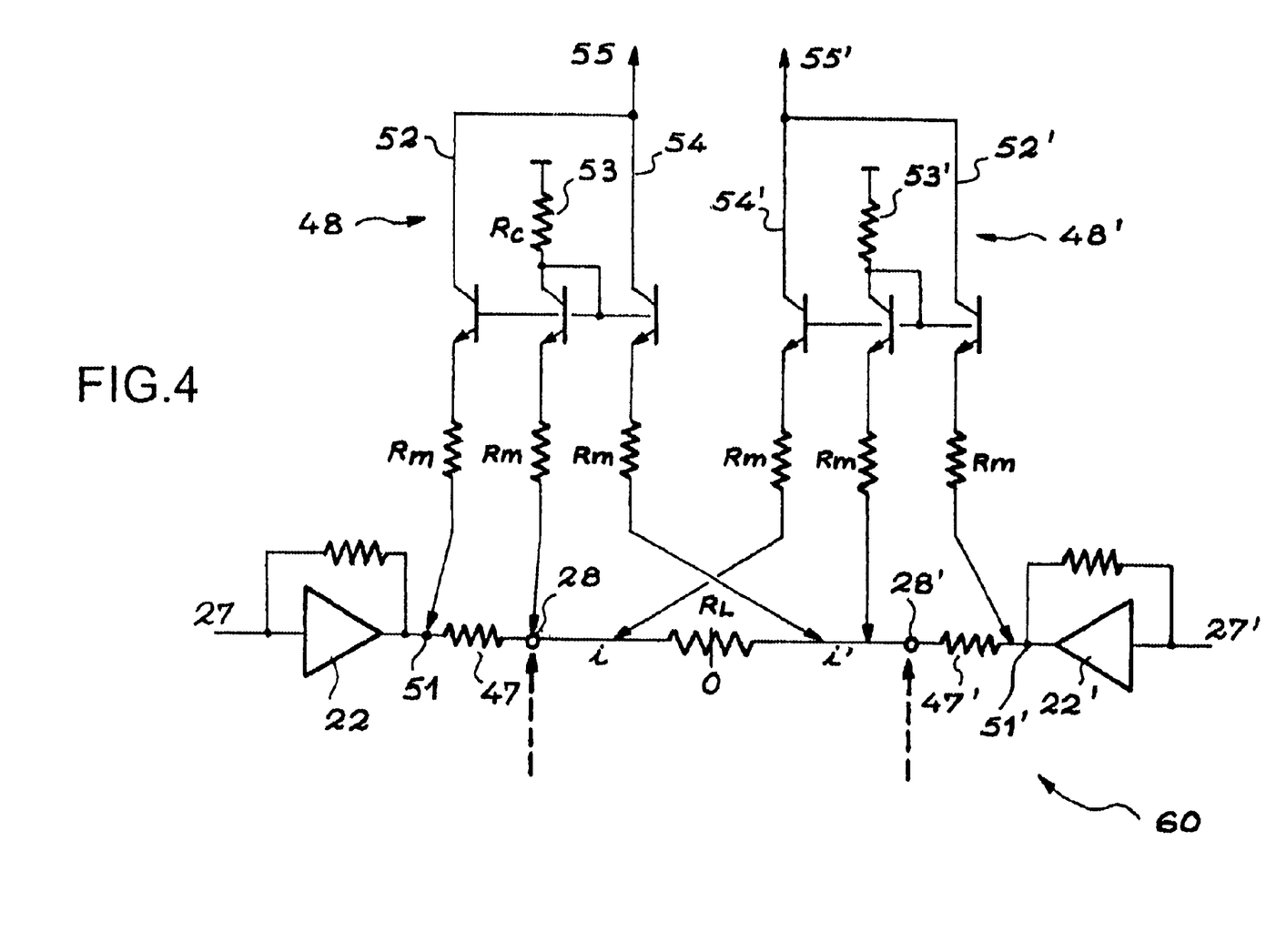
FIG. 4 is an electrical circuit diagram of an embodiment of a part of the identification means for identifying the configuration of the amplifying stage.
Figure 5:
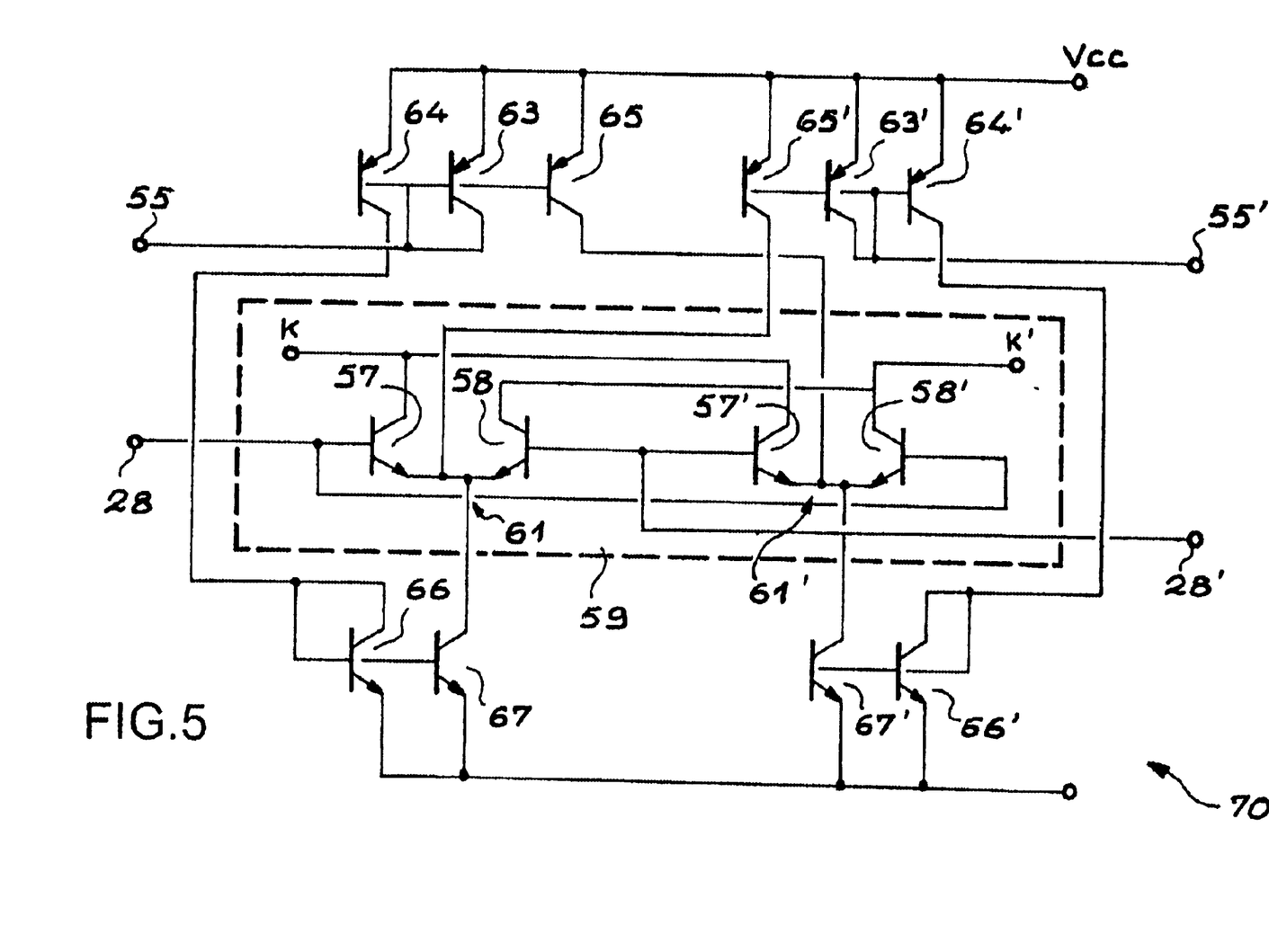
FIG. 5 is an electrical circuit diagram of an embodiment of another part of identification means for identifying the configuration of the amplifying stage.

FIGS. 4 and 5 show an embodiment of identification means 45.

FIG. 4 shows detection means 60 included in the identification means 45. In FIG. 4, the amplifiers 22 and 22' are shown, said amplifiers each having an output resistor Rs 47, 47' arranged between a point 51, 51' and the output 28, 28' respectively. A load impedance RL is assumed to be arranged between the two outputs 28 and 28'. The detection means shown in FIG. 4 comprise a first and a second main branch 48 and 48' respectively. The first main branch 48 comprises three branches 52, 53 and 54. An end of a branch 52 is connected to an output 55 of the branch 48. Said branch comprises a transistor, the collector of which is connected to the output 55, and the emitter of which is connected, through a resistor Rm, to the connection 51 opposite the output 28 of an output resistor 47 of the amplifier 22. A central branch 53 comprises a transistor arranged in a diode configuration, a collector connected to the base, arranged in series with a resistor Rc arranged between the collector of the transistor and a bias-voltage source, and in series with a resistor Rm arranged between the emitter of the transistor and the output 28. A branch 54 is identical to the branch 52. The collector of the transistor of the branch 54 is connected to the output 55 of the branch 48, and the emitter is connected, through a resistor of value Rm, to the output 28' of the amplifier 22'. The second main branch 48' of these detection means 60 included in the identification means 45 and the branch 48 are symmetrical with respect to an imaginary center point 0 of the load resistor RL, thereby dividing the load resistor RL in two half resistors having a value RL/2 each. The resistor RL is intended to produce an output voltage, referenced Vout, having a DC component, referenced $Vout_{dc}$, and an AC component, referenced $Vout_{ac}$. In an idle state, i.e. in the absence of the AC component $Vout_{ac}$, the branch 54 is a current mirror of the branch 53. If an AC component $Vout_{ac}$ appears at the terminals of the load resistor RL, the resistor Rm of the branch 54 is subjected to an additional voltage resulting in an additional current $i'=Vout_{ac}/Rm$ With respect to the rest of the explanation, it is to be noted that if Rc is much larger than Rm, the idle current i, which is equal to $Vout_{ac}/(Rc+Rm)$, is much smaller than i'. For example, if Rc=10 Rm, then i' is more than ten times larger than i. As a result, it is possible to disregard the idle current i in the rest of the explanations. If it is assumed that RL/2 is equal to the sum of the output resistances Rs, then a current i" present in the branch 52 is equal to i'. In this case, the current at the output 55 of the branch 48 is zero. If it is assumed that RL is much larger than Rs, then the current i' in the branch 54 is much larger than the current i" in the branch 52. In this case, the direction of the current at the output 55 is the same as that of the current i' in the branch 54. The same result is obtained for the branch 48'. The current at the output 55' flows in the same direction as the current i' in the branch 54'. If RL is much smaller than Rs, which corresponds particularly to a short-circuit between the outputs 28 and 28' the current i' in the branch 54 is smaller than the current i" in the branch 52. In this case, at the output, there is a current that flows in the same direction as the current i" in the branch 52. This is also true for the branch 48'. Thus, depending on the relative value of the resistors RL and Rs, the direction of flow of the current present at the output 55, 55' of the branches 48 and 48' is either the same as or opposite to the direction of flow of the current at the output of the amplifiers 22, 22'. A comparison between the direction of flow of the current at the output 55, 55' and the direction of flow of the current at the output of the amplifiers 22, 22' indicates whether the amplifier circuit is connected in the symmetrical mode or the asymmetrical mode. For a better understanding of the circuit, some numerical values will be given hereinbelow by way of example. The resistances Rm and Rc may be of the order of 4 kΩ and 40 kΩ, respectively. If a load impedance of 500 Ω is connected to two outputs 28, 28' which are mutually short-circuited by a short-circuit of 2 Ω, corresponding to a welding capacity of 1 nanofarad, a current of 25 μA is obtained, for an amplitude of the output voltage of 100 mV, at the output 55, 55', which is amply sufficient to activate logic circuits included in the adaptation means.

These values show that the output signal Vout is not in the least disturbed by the detection means 60.

FIG. 5 shows selection means 70 included in the identification means 45. These selection means are intended to generate a current, forming the selection signal, the direction of which is always the same and depends only on the relative values of the resistances RL and Rs. This circuit comprises two outputs K, K'. Depending on the relative values of the resistances RL and Rs, only one of these two outputs is energized. The selection means 70 comprise a GILBERT cell 59 including a first and a second pair 61, 61' of NPN transistors 57, 58 and 57', 58' respectively. The selection means additionally comprise a PNP transistor 63 arranged in a diode configuration, the base and the collector of which are connected to an output 55 of the above-described detection means. Two PNP transistor 64, 65 are arranged in a current-mirror configuration with the transistor 63. The collector of the transistor 64 is connected to a collector of an NPN transistor 66 which is arranged in a diode configuration. The collector of the PNP transistor 65 is connected to the common emitter of the second pair 61' of the transistors 57', 58' of the GILBERT cell 59. The selection means 70 comprise, in a symmetrical manner, a PNP transistor 63' arranged in a diode configuration, the base and the collector of which are connected to another output 55' of the detection means described with respect to FIG. 4. Two transistors 65' and 64' are arranged in a current-mirror configuration with the transistor 63'. The collector of the PNP transistor 64' is connected to the collector of an NPN transistor 66' arranged in a diode configuration. The collector of the transistor 65' is connected to the common emitters of the transistors 57, 58 of the first pair 61 of the GILBERT cell 59. The collectors of a first transistor 57, 57' of each pair 61, 61' are connected to a point K forming an output of the circuit 70, and the collectors of a second transistor 58, 58' of each pair 61, 61' are connected to a point K' forming another output of the circuit 70. The common emitters of the transistors of each pair 61, 61' are connected to, respectively, the NPN transistors 67, 67' said transistors 67, 67' being arranged in a current-mirror configuration with the transistors 66 and 66', respectively. The base of the first transistor 57 of the pair 61' and the base of the second transistor 58' of the pair 61' are jointly connected to the output 28 of the amplifying stage. The base of the second transistor 57' of the pair 61' and the base of the first transistor 58 of the first pair 61 are jointly connected to the output 28' of the amplifying stage. Resistors, not shown in the drawing, may be inserted between the output terminals 28, 28' and the bases of the transistors (57, 58') and (57', 58), respectively, to improve the linearity of the GILBERT cell 59.

The operation of the selection means 70 is as follows: If it is assumed that a current signal is supplied by the outputs 55, 55' of the detection means 60, then only one of the outputs K or K' supplies a current. If, at the time of a subsequent alteration, the current signal supplied by the outputs 55, 55' of the detection means 60 changes direction, the biasing of the bases of the transistors 57, 58' and 57',58 of the GILBERT cell received from the outputs 28, 28' are also inversed, so that the current at the output of the cell 59 is present at the same output K or K' than at the time of the preceding alternation. Thus, depending on whether the load resistance RL present between the outputs 28 and 28' is larger than the output resistance Rs of the amplifiers 22, 22', or, conversely, smaller than said output resistance Rs of the amplifiers 22, 22' one of the outputs K or K' supplies a current, for example output K if RL<<Rs, or output K' in the opposite case.

Figure 6:
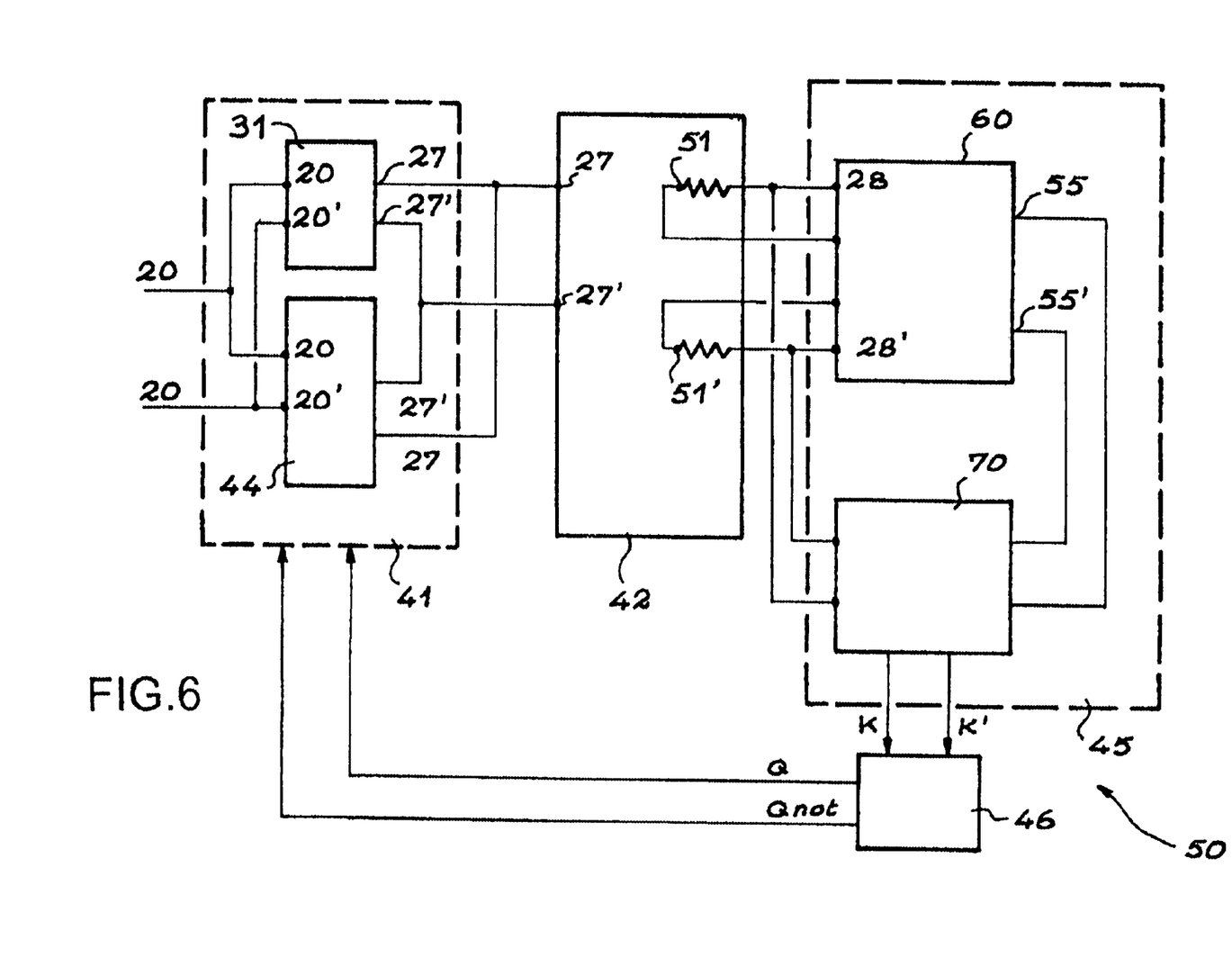
FIG. 6 is a synthesis diagram of FIGS. 3 to 5.

FIG. 6 diagrammatically shows again the assembly shown in FIG. 3 to illustrate the connections between the different parts of the amplifier circuit 50. The outputs 51, 28, 51', 28' of the stage 42 form inputs for the detection means 60 included in the identification means 45. The selection means 70, which form part of the identification means 45, receive the current originating from the outputs 55, 55' of the detection means 60. The outputs K, K' of the selection means 70 generate the selection signal, which is applied to a memory flip-flop included in the adaptation means 46. Outputs Q and Qnot of this memory flip-flop supply activation or deactivation signals intended to be applied in return to the pre-amplifying stage 41 of the amplifier circuit 50. If, in the example described hereinabove, the selection signal is such that the output K is activated and the output K' is deactivated, this means that the value of the load resistance RL is very small as compared to that of the resistances Rs, i.e. the amplifying stage 42 is configured so as to be in the asymmetrical mode. The outputs Q and Qnot of the adaptation means 46 then enter the active or inactive state, represented, for example, by the logic levels 1 and 0, respectively, thereby activating the current sources biasing the long-tail pairs of the second pre-amplifier 44 and deactivating the long-tail pair of the first pre-amplifier 31.

What claim is:

1. An amplifier circuit comprising:
    a preamplifying stage;
    an amplifying stage, and
    identification means for identifying the configuration of the amplifying stage, which circuit is characterized in that it additionally comprises adaptation means to configure the pre-amplifying stage in such a manner that it supplies the amplifying stage with:
        either two signals which are in phase opposition if the amplifying stage is configured so as to be in the symmetrical mode,
        or two signals which are in phase if the amplifying stage is configured so as to be in the asymmetrical mode wherein said pre-amplifying stage comprises two pre-amplifiers, which are both arranged between two inputs of the amplifier circuit and two inputs of the amplify stage, the adaptation means alternately activating one of the two pre-amplifiers and deactivating the other.

2. An amplifier circuit as claimed in claim 1, characterized in that the pre-amplifying stage includes a first preamplifier comprising two transistors forming a long-tail pair, having control terminals which are connected to inputs of the amplifier circuit.

3. An amplifier circuit as claimed in claim 1, characterized in that the pre-amplifying stage includes a second preamplifier comprising four transistors which, arranged two-by-two, form a first and a second long-tail pair, having control terminals which are connected in parallel to inputs of the amplifier circuit, each long-tail pair having an output connected to one of the inputs of the amplifier stage.

4. An amplifier circuit as claimed in claim 1, characterized in that the identification means of the amplifying stage configuration comprise detection means connected to the outputs of said amplify stage, said detection means having at least one output intended to supply a current whose direction is determined univocally by the direction of an output current generated by the amplifier circuit.

5. An amplifier circuit as claimed in claim 1, characterized in that identification means of the amplifying stage configuration comprise selection means connected to detection means and having two outputs intended to be energized alternately according to the direction of the current supplied by the outputs of the detection means.

6. An amplifier circuit as claimed in claim 1, characterized in that the adaptation means comprise a flip-flop intended to store information provided by the identification means, a logic output of said flip-flop being coupled to the pre-amplifying stage.

7. A tuner characterized in that it includes an amplifier circuit as claimed in claim 1.

8. A receiver for receiving radioelectric signals, characterized in that it includes a tuner as claimed in claim 7.

9. A method of optimizing the operation of an amplifier circuit comprising
    a preamplifying stage, and
    an amplifying stage, which method comprises an identification step for identifying the amplifying stage configuration, characterized in that the method additionally includes a configuration step to configure the pre-amplifying stage in such a manner that it supplies the amplifying stage with:
        either two signals which are in phase opposition if the amplifying stage is configured so as to be in the symmetrical mode,
        or two signals which are in phase if the amplifying stage is configured so as to be in the asymmetrical mode the configuration step including alternately activating one of two pre-amplifiers and deactivating another of said two pre-amplifiers.

* * * * *